United States Patent
Zhou et al.

(10) Patent No.: US 11,108,012 B2
(45) Date of Patent: Aug. 31, 2021

(54) DISPLAY PANEL, DISPLAY APPARATUS, METHOD OF DETECTING CRACK IN SEALANT LAYER OF DISPLAY PANEL, AND METHOD OF FABRICATING DISPLAY PANEL

(71) Applicants: BOE TECHNOLOGY GROUP CO., LTD., Beijing (CN); Chengdu BOE Optoelectronics Technology Co., Ltd., Sichuan (CN)

(72) Inventors: Zhenli Zhou, Beijing (CN); Zhiliang Jiang, Beijing (CN); Yinan Liang, Beijing (CN)

(73) Assignees: BOE TECHNOLOGY GROUP CO., LTD., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 590 days.

(21) Appl. No.: 16/071,650

(22) PCT Filed: Jul. 18, 2017

(86) PCT No.: PCT/CN2017/093319
§ 371 (c)(1),
(2) Date: Jul. 20, 2018

(87) PCT Pub. No.: WO2019/014825
PCT Pub. Date: Jan. 24, 2019

(65) Prior Publication Data
US 2021/0175463 A1 Jun. 10, 2021

(51) Int. Cl.
*H01L 51/52* (2006.01)
*H01L 51/56* (2006.01)
(Continued)

(52) U.S. Cl.
CPC ......... *H01L 51/5246* (2013.01); *G09G 3/006* (2013.01); *H01L 27/3276* (2013.01); *H01L 51/56* (2013.01)

(58) Field of Classification Search
CPC . H01L 51/5246; H01L 51/56; H01L 27/3276; G09G 3/006
See application file for complete search history.

(56) References Cited

U.S. PATENT DOCUMENTS

2007/0188079 A1   8/2007   Song et al.
2011/0037744 A1   2/2011   Oh
(Continued)

FOREIGN PATENT DOCUMENTS

| CN | 102338943 A | 2/2012 |
| CN | 105467632 A | 4/2016 |

(Continued)

OTHER PUBLICATIONS

First Office Action in the Indian Patent Application No. 201847038966, dated Jul. 16, 2020.
(Continued)

*Primary Examiner* — Lex H Malsawma
(74) *Attorney, Agent, or Firm* — Intellectual Valley Law, P.C.

(57) ABSTRACT

The present application discloses a display panel. The display panel includes a first substrate; a second substrate facing the first substrate; a sealant layer between the first substrate and the second substrate sealing the first substrate and the second substrate together to form a cell; and a first conductive line layer having a first continuous conductive line configured to detect crack in the sealant layer. The first conductive line layer is in contact with the sealant layer.

17 Claims, 4 Drawing Sheets

(51) Int. Cl.
    *H01L 27/32*     (2006.01)
    *G09G 3/00*     (2006.01)

(56)     References Cited

U.S. PATENT DOCUMENTS

| | | | |
|---|---|---|---|
| 2016/0307971 A1 | 10/2016 | Jeon | |
| 2017/0098797 A1* | 4/2017 | Eom | .................. H01L 27/3276 |
| 2017/0270842 A1* | 9/2017 | Nam | ...................... G09G 3/006 |
| 2018/0053792 A1* | 2/2018 | Shin | .................... H01L 27/1218 |
| 2018/0210245 A1 | 7/2018 | Yao et al. | |

FOREIGN PATENT DOCUMENTS

| | | |
|---|---|---|
| CN | 106057853 A | 10/2016 |
| JP | 2007220647 A | 8/2007 |
| JP | 2013011663 A | 1/2013 |
| JP | 2012220792 A | 2/2014 |
| JP | 2014021479 A | 2/2014 |
| KR | 20130075316 A | 7/2013 |

OTHER PUBLICATIONS

The Extended European Search Report in the European Patent Application No. 17904362.5, dated Dec. 14, 2020.
First Office Action in the Korean Patent Application No. 20187027645, dated Aug. 28, 2019; English translation attached.
First Office Action in the Australian Patent Application No. 2017408796, dated Oct. 10, 2019.
First Office Action in the Japanese Patent Application No. 2018553471, dated Jun. 7, 2021; English translation attached.

* cited by examiner

DISPLAY PANEL, DISPLAY APPARATUS, METHOD OF DETECTING CRACK IN SEALANT LAYER OF DISPLAY PANEL, AND METHOD OF FABRICATING DISPLAY PANEL

CROSS-REFERENCE TO RELATED APPLICATION

This application is a national stage application under 35 U.S.C. § 371 of International Application No. PCT/CN2017/093319, filed Jul. 18, 2017, the contents of which are incorporated by reference in the entirety.

TECHNICAL FIELD

The present invention relates to display technology, more particularly, to a display panel, a display apparatus, a method of detecting crack in a sealant layer of a display panel, and a method of fabricating a display panel.

BACKGROUND

Display apparatuses such as liquid crystal display (LCD) apparatuses and organic light-emitting diode (OLED) display apparatuses have been widely used. Typically, a liquid crystal display apparatus includes a counter substrate and an array substrate facing each other. Thin film transistors, gate lines, data lines, pixel electrodes, common electrodes, and common electrode lines are disposed on the array substrate and the counter substrate. Between the two substrates, a liquid crystal material is injected to form a liquid crystal layer. Typically, an organic light-emitting diode display apparatus includes a counter substrate and an array substrate facing each other. The array substrate in the organic light-emitting diode display apparatus includes an anode, a light emitting layer and a cathode. In the liquid crystal display apparatuses and the organic light-emitting diode display apparatuses, the array substrate and the counter substrate are typically sealed together using a frame sealant such as a glass frit seal material.

SUMMARY

In one aspect, the present invention provides a display panel comprising a first substrate; a second substrate facing the first substrate; a sealant layer between the first substrate and the second substrate sealing the first substrate and the second substrate together to form a cell; and a first conductive line layer comprising a first continuous conductive line configured to detect crack in the sealant layer; wherein the first conductive line layer is in contact with the sealant layer.

Optionally, the first conductive line layer is in a peripheral area of the display panel and substantially encircles a display area of the display panel; and a projection of the sealant layer on the first substrate substantially covers that of the first conductive line layer.

Optionally, the projection of the first conductive line layer on the first substrate is substantially in the center of the projection of the sealant layer at any point along the length of the first conductive line layer where the projection of the first conductive line layer and the projection of the sealant layer overlap.

Optionally, the display panel further comprises at least one bonding lead in a driver integrated circuit bonding area, the at least one bonding lead electrically connected to the first conductive line layer.

Optionally, the display panel further comprises a second conductive line layer comprising a second continuous conductive line configured to detect crack in the display panel; wherein the second conductive line layer is in the peripheral area of the display panel; and a projection of the sealant layer on the first substrate is substantially non-overlapping with that of the second conductive line layer.

Optionally, the first conductive line layer encircles a first area of the display panel; the second conductive line layer encircles a second area of the display panel; and the first area is in the second area.

Optionally, the display panel further comprises two lead wires respectively connected to two terminals of the first conductive line layer; wherein each of the two lead wires electrically connects the first conductive line layer to the second conductive line layer.

Optionally, the display panel further comprises two bonding leads in a driver integrated circuit bonding area, the two bonding leads electrically connected to the second conductive line layer; wherein the first conductive line layer is electrically connected to the two bonding leads through the two lead wires and the second conductive line layer.

Optionally, a line width of the first conductive line layer is approximately 1/200 to approximately 1/50 of a width of the sealant layer; and a line thickness of the first conductive line layer is approximately 1/20 to approximately 1/5 of a thickness of the sealant layer.

Optionally, the line width of the first conductive line layer is in a range of approximately 2.5 μm to approximately 10 μm and the line thickness of the first conductive line layer is in a range of approximately 0.25 μm to approximately 1 μm.

Optionally, the first conductive line layer is on a side of the sealant layer distal to the second substrate.

Optionally, the display panel is an organic light emitting diode display panel; the first substrate comprises a first base substrate, a gate insulating layer on the first base substrate, a gate electrode layer on a side of the gate insulating layer distal to the first base substrate, and an inter-layer dielectric layer on a side of the gate electrode layer distal to the gate insulating layer, and the first conductive line layer is on a side of the sealant layer proximal to inter-layer dielectric layer.

Optionally, the sealant layer is a frit seal layer comprising a frit seal material.

Optionally, a projection of the first continuous conductive line on the first substrate has a square wave pattern.

In another aspect, the present invention provides a display apparatus comprising a display panel described herein.

In another aspect, the present invention provides a method of detecting crack in a sealant layer of a display panel described herein, comprising measuring a resistance of the first continuous conductive line; wherein the resistance greater than a threshold value indicates presence of crack in the sealant layer.

In another aspect, the present invention provides a substrate comprising a sealant layer; and a first conductive line layer comprising a first continuous conductive line configured to detect crack in the sealant layer; wherein the first conductive line layer is in contact with the sealant layer.

Optionally, the first conductive line layer is in a peripheral area of the substrate and substantially encircles a display area of the substrate; and a projection of the sealant layer on the substrate substantially covers that of the first conductive line layer.

Optionally, the substrate further comprises a second conductive line layer comprising a second continuous conductive line configured to detect crack in the substrate; wherein the second conductive line layer is in the peripheral area of the substrate; and a projection of the sealant layer on the substrate is substantially non-overlapping with that of the second conductive line layer.

In another aspect, the present invention provides a method of fabricating a display panel, comprising forming a first substrate; forming a second substrate; forming a sealant material layer on the second substrate, the sealant material layer is formed in a peripheral area of the second substrate and enclosing a display area of the second substrate; forming a first conductive line layer comprising a first continuous conductive line on the first substrate, the first conductive line layer is formed in a peripheral area of the first substrate and encircling a first area of the first substrate; and assembling the first substrate and the second substrate in a cell by adhering the sealant material layer onto the first substrate, thereby forming a sealant layer sealing a display area of the display panel; wherein the first conductive line layer is formed to be in contact with the sealant layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
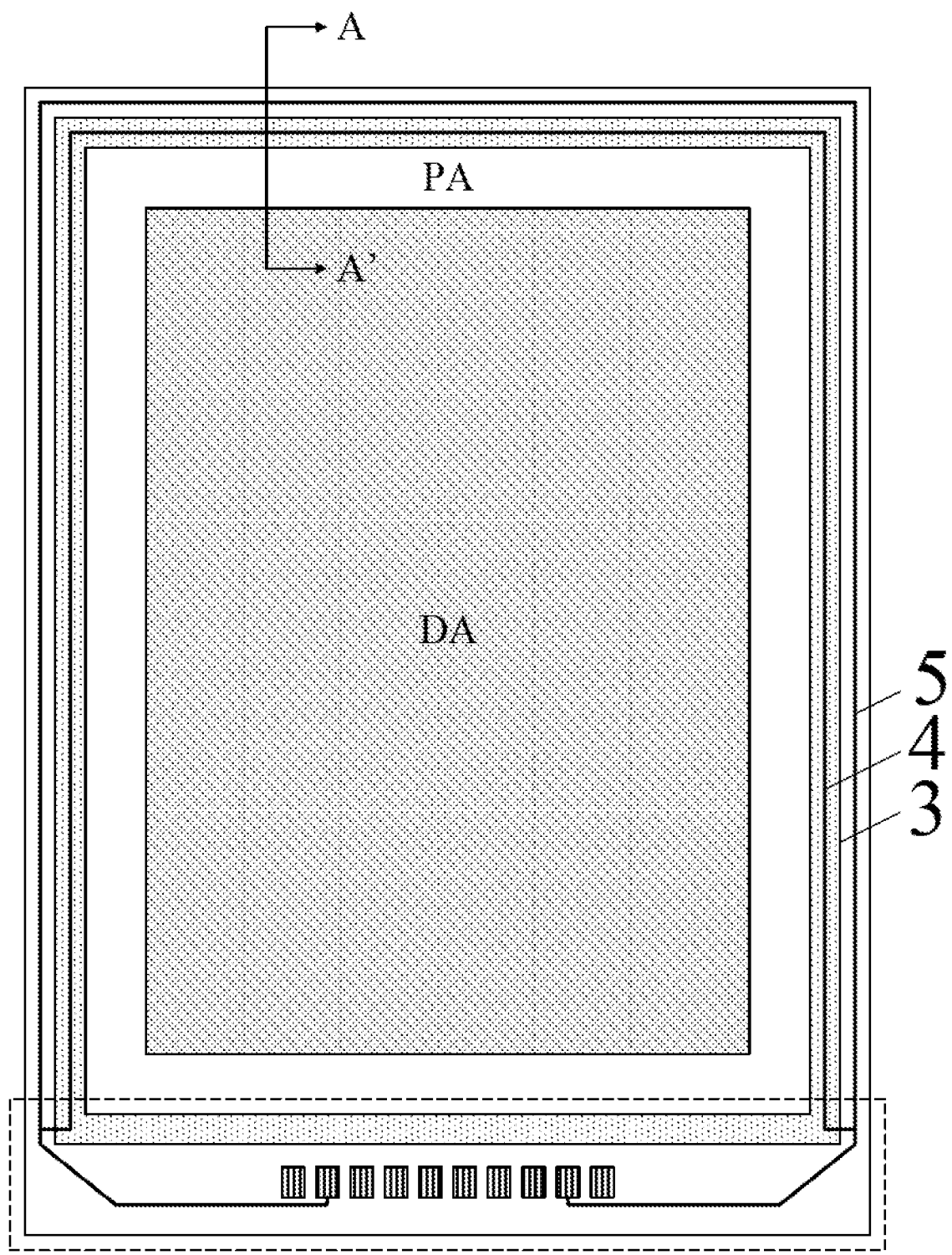
FIG. 1 is a plan view of a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional display panels, a sealant layer seals an array substrate and a counter substrate together to form a cell. The sealant layer insulates the display components in the display area of the display panel from external oxygen and moist. Typically, the sealant layer is made of a glass frit seal material, which is highly oxygen-resistant and moist-resistant. However, the glass frit seal material, like many other sealant material, is a brittle material that is prone to crack and other damages. Often times the sealant layer contains micro-cracks that are not easily detectable to visual inspection. The micro-cracks may quickly spread through the sealant layer, e.g., forming a crack crossing over the entire width of the sealant layer, later in the fabricating process or during use by a consumer. Conventional detection methods and apparatuses do not provide an effective way of examining and detecting these micro-cracks in the sealant layer.

Accordingly, the present disclosure provides, inter alia, a display panel, a display apparatus, a method of detecting crack in a sealant layer of a display panel, and a method of fabricating a display panel that substantially obviate one or more of the problems due to limitations and disadvantages of the related art. In one aspect, the present disclosure provides a display panel. In some embodiments, the display panel includes a first substrate; a second substrate facing the first substrate; a sealant layer between the first substrate and the second substrate sealing the first substrate and the second substrate together to form a cell; and a first conductive line layer having a first continuous conductive line configured to detect crack in the sealant layer. The first conductive line layer is in contact with the sealant layer.

As used herein the term "peripheral area" refers to an area where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

As used herein, the term "display area" refers to an area of a display panel or a display substrate (e.g., an array substrate or a counter substrate) in a display panel where image is actually displayed.

As used herein, the term "encircle" refers to "to pass completely around." The term encircle is not limited to mean literally forming a circle, although it may include forming a circle, but may also include entirely or partially forming a perimeter around, entirely or partially surrounding, and/or being located at near an entire or partial periphery of that which is being encircled.

Figure 2:
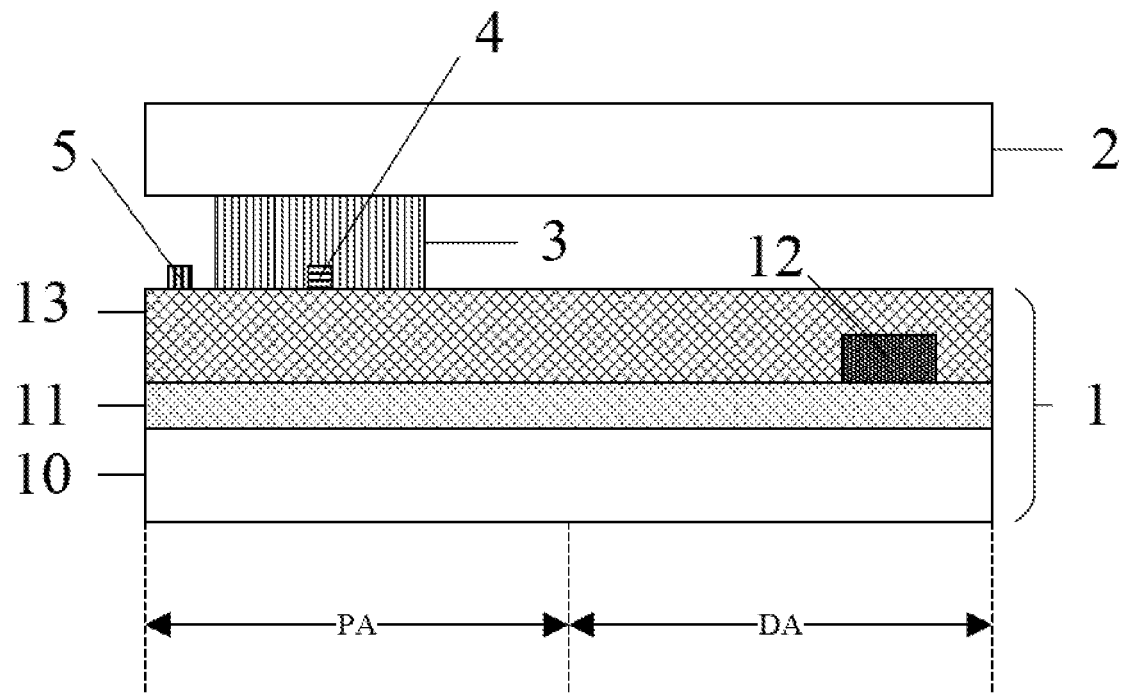
FIG. 2 is a cross-sectional view along line A-A' of the display panel in FIG. 1.
Figure 3:
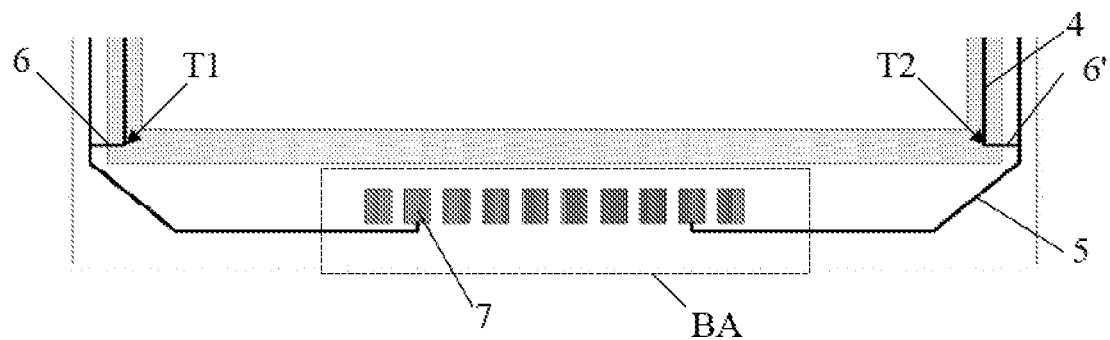
FIG. 3 is a zoom-in view of an area encircled by dotted lines in FIG. 1.

FIG. 1 is a plan view of a display panel in some embodiments according to the present disclosure. FIG. 2 is a cross-sectional view along line A-A' of the display panel in FIG. 1. FIG. 3 is a zoom-in view of an area encircled by dotted lines in FIG. 1. Referring to FIGS. 1 to 3, the display panel in some embodiments includes a first substrate 1, a second substrate 2 facing the first substrate 1, a sealant layer 3 between the first substrate 1 and the second substrate 2 sealing the first substrate 1 and the second substrate 2 together to form a cell, and a first conductive line layer 4 configured to detect crack in the sealant layer 3. As shown in FIG. 1, the first conductive line layer 4 includes a first continuous conductive line. Optionally, the first substrate is an array substrate of the display panel, and the second substrate is a counter substrate (e.g., an encapsulating substrate) of the display panel. Optionally, the second substrate is an array substrate of the display panel, and the first substrate is a counter substrate (e.g., an encapsulating substrate) of the display panel. Optionally, the display panel is an organic light emitting diode display panel. Optionally, the display panel is a liquid crystal display panel.

The sealant layer 3 can be made of any suitable sealant material such as a glass frit seal material, a solder seal material, a glue seal material, an adhesive seal material (e.g., an epoxy seal material). The sealant layer 3 can contain organic or inorganic material, e.g., glass or organic adhesives. Glass materials useful for making the sealant layer 3 include, but are not limited to, magnesium oxide, calcium oxide, barium oxide, lithium oxide, sodium oxide, potassium oxide, vanadium oxide, zinc oxide, tellurium oxide, aluminum oxide, silicon dioxide, lead oxide, tin oxide, phosphorous oxide, ruthenium oxide, rubidium oxide, rhodium oxide, ferric oxide, copper oxide, titanium oxide, tungsten oxide, bismuth oxide, stibium oxide, or combinations thereof. Optionally, the sealant layer 3 is a frit seal layer having a frit seal material. Optionally, the sealant layer 3 is a glass frit seal layer having a glass frit seal material.

The first conductive line layer 4 may be made of any suitable conductive material such as a metal material, an alloy material, a carbon nano-tube material, and a graphene material.

Referring to FIG. 1, the display panel includes a display area DA and a peripheral area PA outside the display area DA. The sealant layer 3 is in the peripheral area PA and encloses the display area DA of the display panel. The first conductive line layer 4 is also in the peripheral area, encircling a first area of the display panel. The first conductive line layer 4 is in contact with the sealant layer 3. By having this design, the first conductive line layer 4 can be used to detect occurrence of crack in the sealant layer 3. Because the first conductive line layer 4 is in contact with the sealant layer 3, when a crack occurs in the sealant layer 3, the stress produced by the crack results in defects, line breaks, or even line open in the first continuous conductive line of the first conductive line layer 4. The defects and line break increase the resistance of the first continuous conductive line. The line open breaks the first continuous conductive line into two portions, leading to a much higher resistance of the first conductive line layer 4. Thus, by measuring the resistance of the first conductive line layer 4, it can be determined whether or not a crack occurs in the sealant layer 3. For example, a reference conductive line layer free of defects, line breaks, and line open may have a resistance of a first value. The first conductive line layer 4 having the same dimensions as the reference conductive line layer may have a measured resistance of a second value. If the second value is greater than a threshold value (e.g., 10 times of the first value), it can be determined that a crack occurs in the sealant layer 3, resulting in the increased resistance of the first conductive line layer 4.

In some embodiments, in plan view of the display panel, a projection of the sealant layer 3 on the first substrate 1 at least partially overlaps with that of the first conductive line layer 4. Optionally, in plan view of the display panel, the projection of the sealant layer 3 on the first substrate 1 substantially overlaps with that of the first conductive line layer 4. Referring to FIG. 1 and FIG. 2, in plan view of the display panel, the projection of the sealant layer 3 on the first substrate 1 substantially coves that of the first conductive line layer 4. Optionally, in plan view of the display panel, the projection of the sealant layer 3 on the first substrate 1 completely covers that of the first conductive line layer 4. Optionally, in plan view of the display panel, the projection of the first conductive line layer 4 on the first substrate 1 is substantially in the center of the projection of the sealant layer 3 at any point along the length of the first conductive line layer 4 where the projection of the first conductive line layer 4 and the projection of the sealant layer 3 overlap. The first conductive line layer 4 may be on a side of the sealant layer 3 distal to the second substrate 2 (as shown in FIG. 2). Optionally, the first conductive line layer 4 is on a side of the sealant layer 3 distal to the first substrate 1.

Referring to FIG. 1 and FIG. 3, in some embodiments, the display panel further includes at least one (e.g., two) bonding lead 7 in a driver integrated circuit bonding area BA. The at least one (e.g., two) bonding lead 7 is electrically connected to the first conductive line layer 4 (directly or indirectly).

In some embodiments, and referring to FIG. 1 and FIG. 2, the display panel further includes a second conductive line layer 5. The second conductive line layer 5 includes a second continuous conductive line, and is configured to detect crack in the display panel, e.g., crack in the first substrate 1 or the second substrate 2. The second conductive line layer 5 is in the peripheral area PA of the display panel, and encircles a second area of the display panel. The first area encircled by the first conductive line layer 4 is in the second area encircled by the second conductive line layer 5. The second conductive line layer 5 may be made of any suitable conductive material such as a metal material, an alloy material, a carbon nano-tube material, and a graphene material. In some embodiments, in plan view of the display panel, a projection of the sealant layer 3 on the first substrate 1 is substantially non-overlapping with that of the second conductive line layer 5.

Referring to FIG. 3, in some embodiments, the display panel further includes two lead wires 6 and 6'. The lead wire 6 is electrically connected to a first terminal T1 of the first conductive line layer 4, and the lead wire 6' is electrically connected to a second terminal T2 of the first conductive line layer 4. The lead wire 6 electrically connects the first conductive line layer 4 to the second conductive line layer 5. Similarly, the lead wire 6' electrically connects the first conductive line layer 4 to the second conductive line layer 5. When the first conductive line layer 4 is electrically connected to the second conductive line layer 5, it can be electrically connected to the bonding leads 7 in the driver integrated circuit bonding area BA through the second conductive line layer 5. The bonding leads 7 can be connected to pins in a driver integrated circuit attached to the driver integrated circuit bonding area BA. Measurement of resistance of the first conductive line layer 4 and the second conductive line layer 5 can be conveniently conducted through the pins in the driver integrated circuit.

Various other appropriate methods may be used to connect the terminals of the first conductive line layer 4 to the bonding leads 7 or other terminals for measuring resistance of the first conductive line layer 4. In one example, the first terminal T1 and the second terminal T2 are electrically connected to the bonding leads 7 through conductive tapes.

To achieve a high sensitivity detection of crack in the sealant layer 3, the first conductive line layer 4 can be made to have certain dimensions. In some embodiments, a line width of the first continuous conductive line of the first conductive line layer 4 is approximately 1/200 to approximately 1/50 (e.g., approximately 1/150 to approximately 1/75, approximately 1/100) of a width of the sealant layer 3. In some embodiments, a line thickness of the first continuous conductive line of the first conductive line layer 4 is approximately 1/20 to approximately 1/5 (e.g., approximately 1/15 to approximately 1/7.5, approximately 1/10) of a thickness of the sealant layer 3. In one example, the sealant layer 3 has a width of approximately 500 µm and a thickness of approximately 5 µm. Optionally, the line width of the first continuous conductive line of the first conductive line layer 4 is in a range of approximately 2.5 µm to approximately 10 µm, e.g., approximately 3.75 µm to approximately 7.5 µm, approximately 5 µm. Optionally, the line thickness of the first continuous conductive line of the first conductive line layer 4 is in a range of approximately 0.25 µm to approximately 1 µm, e.g., approximately 0.375 µm to approximately 0.75 µm, approximately 0.5 µm.

Referring to FIG. 2, the first substrate 1 in some embodiments includes a first base substrate 10, a gate insulating layer 11 on the first base substrate 10, a gate electrode layer 12 on a side of the gate insulating layer 11 distal to the first base substrate 10, and an inter-layer dielectric layer 13 on a side of the gate electrode layer 12 distal to the gate insulating layer 11. The first conductive line layer 4 is on a side of the inter-layer dielectric layer 13 distal to the gate insulating layer 11. Optionally, the first conductive line layer 4 is on a side of the sealant layer 3 proximal to the inter-layer dielectric layer 13. The second conductive line layer 5 is on side of the inter-layer dielectric layer 13 distal to the gate insulating layer 11. The first conductive line layer 4 and the second conductive line layer 5 are in the peripheral area PA, the gate electrode layer 12 is in the display area DA. The second conductive line layer 5 is outside the area enclosed by the sealant layer 3. Optionally, the display panel is an organic light emitting diode display panel, and the second substrate 2 is an encapsulating substrate.

Figure 4:
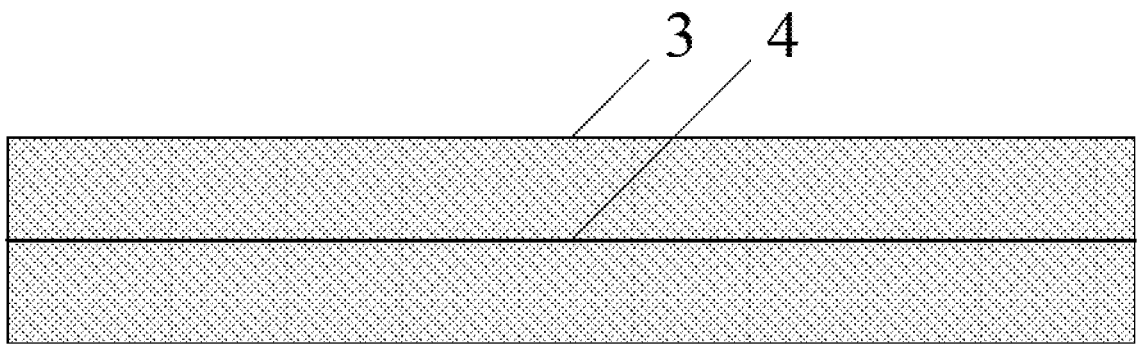
FIG. 4 is a schematic diagram illustrating a pattern of the first conductive line layer in some embodiments according to the present disclosure.
Figure 5:
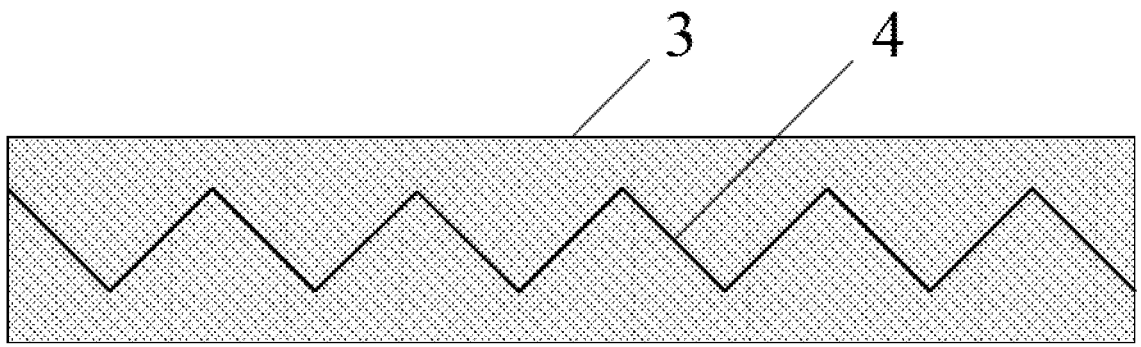
FIG. 5 is a schematic diagram illustrating a pattern of the first conductive line layer in some embodiments according to the present disclosure.
Figure 6:
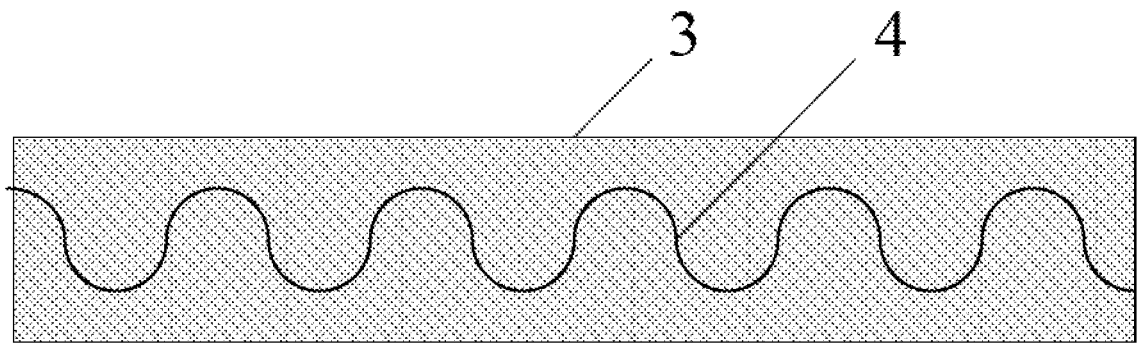
FIG. 6 is a schematic diagram illustrating a pattern of the first conductive line layer in some embodiments according to the present disclosure.
Figure 7:
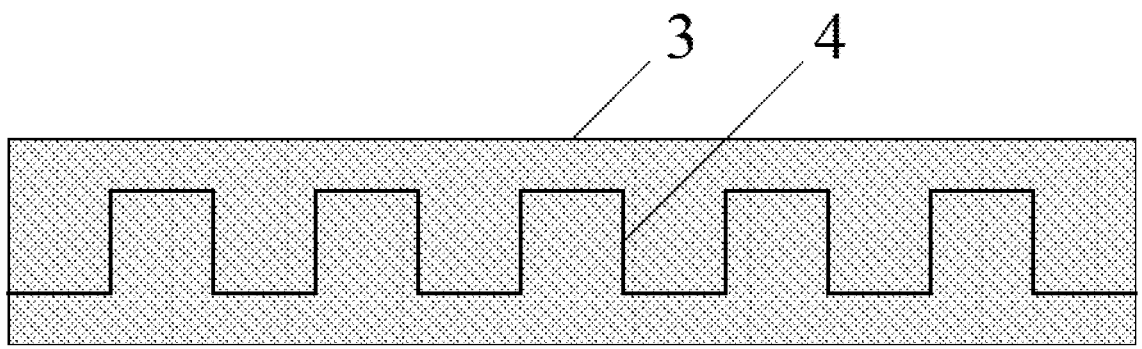
FIG. 7 is a schematic diagram illustrating a pattern of the first conductive line layer in some embodiments according to the present disclosure.

The first conductive line layer 4 may have any appropriate pattern. FIGS. 4 to 7 are schematic diagrams illustrating some exemplary patterns of the first conductive line layer in some embodiments according to the present disclosure. The first conductive line layer 4 in FIG. 4 is a straight line in a portion of the sealant layer 3 as shown. The first conductive line layer 4 in FIG. 5 has a zig-zag pattern in a portion of the sealant layer 3 as shown. The first conductive line layer 4 in FIG. 6 is a curved line and has a wavy pattern in a portion of the sealant layer 3 as shown. The first conductive line layer 4 in FIG. 7 is a curved line and has a square wave pattern in a portion of the sealant layer 3 as shown.

In another aspect, the present disclosure provides a method of detecting crack in a sealant layer of a display panel described herein. In some embodiments, the method includes measuring a resistance of the first continuous conductive line. Optionally, the measured resistance greater than a threshold value indicates presence of crack in the sealant layer. Optionally, the measured resistance equal to or less than the threshold value indicates absence of crack in the sealant layer. In one example, a reference resistance value may be determined by measuring a reference conductive line layer free of defects, line breaks, and line open and having substantially the same dimensions as the first conductive line layer. The threshold value may be determined based on the reference resistance value, e.g., empirically. For example, the threshold value may be 10 times of the reference resistance value.

In some embodiments, the method includes measuring a resistance of the first continuous conductive line; and based on a result of the measuring, determining whether a re-evaluation of the integrity of the sealant layer is necessary. Optionally, when the resistance measured from the first continuous conductive line is in a first range, it is determined that the sealant layer is substantially intact, and no re-evaluation of the integrity of the sealant layer is necessary. Optionally, when the resistance measured from the first continuous conductive line is in a second range, it is determined that the sealant layer is substantially damaged, and no re-evaluation of the integrity of the sealant layer is necessary. Optionally, when the resistance measured from the first continuous conductive line is in a third range, it is determined that the re-evaluation of the integrity of the sealant layer is necessary. Optionally, the third range is between the first range and the second range. Optionally, the first range, the second range, and the third range are substantially non-overlapping ranges.

In another aspect, the present disclosure provides a substrate in a display panel. In some embodiments, the substrate includes a sealant layer and a first conductive line layer having a first continuous conductive line configured to detect crack in the sealant layer, the first conductive line layer is in contact with the sealant layer. Optionally, the first conductive line layer is in a peripheral area of the substrate and substantially encircles a display area of the substrate. Optionally, a projection of the sealant layer on the substrate substantially covers that of the first conductive line layer. Optionally, the projection of the first conductive line layer on the substrate is substantially in the center of the projection of the sealant layer at any point along the length of the first conductive line layer where the projection of the first conductive line layer and the projection of the sealant layer overlap. Optionally, the substrate further includes at least one bonding lead in a driver integrated circuit bonding area, the at least one bonding lead electrically connected to the first conductive line layer.

In some embodiments, the substrate further includes a second conductive line layer having a second continuous conductive line configured to detect crack in the substrate or in a display panel having the substrate. The second conductive line layer is in the peripheral area of the substrate. A projection of the sealant layer on the substrate is substantially non-overlapping with that of the second conductive line layer. Optionally, the first conductive line layer encircles a first area of the substrate, the second conductive line layer encircles a second area of the substrate, and the first area is in the second area. Optionally, the substrate further includes two lead wires respectively connected to two terminals of the first conductive line layer, each of the two lead wires electrically connects the first conductive line layer to the second conductive line layer. Optionally, the substrate further includes two bonding leads in a driver integrated circuit bonding area, the two bonding leads are electrically connected to the second conductive line layer, and the first conductive line layer is electrically connected to the two bonding leads through the two lead wires and the second conductive line layer.

In some embodiments, a line width of the first continuous conductive line of the first conductive line layer is approximately 1/200 to approximately 1/50 (e.g., approximately 1/150 to approximately 1/75, approximately 1/100) of a width of the sealant layer. In some embodiments, a line thickness of the first continuous conductive line of the first conductive line layer is approximately 1/20 to approximately 1/5 (e.g., approximately 1/15 to approximately 1/7.5, approximately 1/10) of a thickness of the sealant layer. In one example, the sealant layer has a width of approximately 500 μm and a thickness of approximately 5 μm. Optionally, the line width of the first continuous conductive line of the first conductive line layer is in a range of approximately 2.5 μm to approximately 10 μm, e.g., approximately 3.75 μm to approximately 7.5 μm, approximately 5 μm. Optionally, the line thickness of the first continuous conductive line of the first conductive line layer is in a range of approximately 0.25 μm to approximately 1 μm, e.g., approximately 0.375 μm to approximately 0.75 μm, approximately 0.5 μm.

In some embodiments, the substrate is an organic light emitting diode array substrate. Optionally, the substrate includes a base substrate, a gate insulating layer on the base substrate, a gate electrode layer on a side of the gate insulating layer distal to the base substrate, and an inter-layer dielectric layer on a side of the gate electrode layer distal to the gate insulating layer. Optionally, the first conductive line layer is on a side of the sealant layer proximal to inter-layer dielectric layer.

The sealant layer can be made of any suitable sealant material such as a glass frit seal material, a solder seal material, a glue seal material, an adhesive seal material (e.g., an epoxy seal material). The sealant layer can contain organic or inorganic material, e.g., glass or organic adhesives. Glass materials useful for making the sealant layer include, but are not limited to, magnesium oxide, calcium oxide, barium oxide, lithium oxide, sodium oxide, potassium oxide, vanadium oxide, zinc oxide, tellurium oxide aluminum oxide, silicon dioxide, lead oxide, tin oxide, phosphorous oxide, ruthenium oxide, rubidium oxide, rhodium oxide, ferric oxide, copper oxide, titanium oxide, tungsten oxide, bismuth oxide, stibium oxide, or combinations thereof. Optionally, the sealant layer is a frit seal layer having a frit seal material. Optionally, the sealant layer is a glass frit seal layer having a glass frit seal material The first conductive line layer may have any appropriate pattern. Optionally, the first conductive line layer is a straight line in a portion of the sealant layer. Optionally, the first conductive line layer has a zig-zag pattern in a portion of the sealant layer. Optionally, the first conductive line layer is a curved line and has a wavy pattern in a portion of the sealant layer. Optionally, the first conductive line layer is a curved line and has a square wave pattern in a portion of the sealant layer.

In another aspect, the present disclosure provides a method of fabricating a display panel. In some embodiments, the method includes forming a first substrate; forming a second substrate; forming a sealant material layer on the second substrate, the sealant material layer being formed in a peripheral area of the second substrate and enclosing a display area of the second substrate; forming a first conductive line layer having a first continuous conductive line on the first substrate, the first conductive line layer being formed in a peripheral area of the first substrate and encircling a first area of the first substrate; and assembling the first substrate and the second substrate in a cell by adhering the sealant material layer onto the first substrate, thereby forming a sealant layer sealing a display area of the display panel. Optionally, the method further includes curing the sealant material layer subsequent to the assembling step, thereby forming the sealant layer sealing the first substrate and the second substrate together.

In some embodiments, the sealant layer and the first conductive line layer are formed so that a projection of the sealant layer on the first substrate at least partially overlaps with that of the first conductive line layer in plan view of the display panel. Optionally, the sealant layer and the first conductive line layer are formed so that the projection of the sealant layer on the first substrate substantially overlaps with that of the first conductive line layer in plan view of the display panel. Optionally, the sealant layer and the first conductive line layer are formed so that the projection of the sealant layer on the first substrate substantially covers that of the first conductive line layer in plan view of the display panel. Optionally, the sealant layer and the first conductive line layer are formed so that the projection of the sealant layer on the first substrate completely covers that of the first conductive line layer in plan view of the display panel. Optionally, the sealant layer and the first conductive line layer are formed so that, in plan view of the display panel, the projection of the first conductive line layer on the first substrate is substantially in the center of the projection of the sealant layer at any point along the length of the first conductive line layer where the projection of the first conductive line layer and the projection of the sealant layer overlap.

Optionally, the method further includes forming at least one bonding lead in a driver integrated circuit bonding area of the display panel, the at least one bonding lead is formed to be electrically connected to the first conductive line layer.

In some embodiments, the method further includes forming a second conductive line layer having a second continuous conductive line on the first substrate. The second conductive line layer is formed in a peripheral area of the first substrate and encircling a second area of the first substrate. The first conductive line layer is formed in a peripheral area of the first substrate and encircling a first area of the first substrate. The first area is in the second area.

Optionally, the second conductive line layer and the sealant layer are formed so that a projection of the sealant layer on the first substrate is substantially non-overlapping with that of the second conductive line layer.

In some embodiments, the method further includes forming two lead wires respectively connected to two terminals of the first conductive line layer. Each of the two lead wires is formed to electrically connect the first conductive line layer to the second conductive line layer. Optionally, the method further includes forming two bonding leads in a driver integrated circuit bonding area of the display panel. The two bonding leads are formed to be electrically connected to the second conductive line layer. The first conductive line layer is formed to be electrically connected to the two bonding leads through the two lead wires and the second conductive line layer.

In another aspect, the present disclosure provides a display apparatus having a display panel described herein or fabricated by a method described herein. Optionally, the display apparatus is an organic light emitting diode display apparatus. Optionally, the display apparatus is a liquid crystal display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
a first substrate;
a second substrate facing the first substrate;
a sealant layer between the first substrate and the second substrate sealing the first substrate and the second substrate together to form a cell;
a first conductive line layer comprising a first continuous conductive line configured to detect crack in the sealant layer;
a second conductive line layer comprising a second continuous conductive line configured to detect crack in the display panel;
two lead wires respectively connecting two terminals of the first conductive line layer to the second conductive line layer; and
two bonding leads in a driver integrated circuit bonding area, the two bonding leads electrically connected to the second conductive line layer;
wherein the first conductive line layer is in contact with the sealant layer;
the second conductive line layer is in a peripheral area of the display panel;
an orthographic projection of the sealant layer on the first substrate is substantially non-overlapping with an orthographic projection of the second conductive line layer on the first substrate; and
the first conductive line layer is electrically connected to the two bonding leads sequentially through the two lead wires and the second conductive line layer.

2. The display panel of claim 1, wherein
the first conductive line layer is in the peripheral area of the display panel and substantially encircles a display area of the display panel; and
an orthographic projection of the sealant layer on the first substrate substantially covers that of the first conductive line layer.

3. The display panel of claim 2, wherein
the orthographic projection of the first conductive line layer on the first substrate is substantially in a center of the orthographic projection of the sealant layer at any point along a length of the first conductive line layer where the orthographic projection of the first conductive line layer and the orthographic projection of the sealant layer overlap.

4. The display panel of claim 1, further comprising at least one bonding lead in a driver integrated circuit bonding area, the at least one bonding lead electrically connected to the first conductive line layer.

5. The display panel of claim 1, wherein the second conductive line layer encircles the first conductive line layer; and
display panel; and
an orthographic projection of a respective one of the two lead wires on the first substrate partially overlaps with the orthographic projection of the sealant layer on the first substrate, and partially non-overlapping with the orthographic projection of the sealant layer on the first substrate.

6. The display panel of claim 1 wherein the first conductive line layer, the two lead wires, and a portion of the second conductive line layer form a complete loop; and
any point in a region having a boundary comprising the first conductive line layer, the two lead wires, and the portion of the second conductive line layer is completely outside of a display area of the display panel.

7. The display panel of claim 1, wherein a line width of the first conductive line layer is approximately 1/200 to approximately 1/50 of a width of the sealant layer; and
a line thickness of the first conductive line layer is approximately 1/20 to approximately 1/5 of a thickness of the sealant layer.

8. The display panel of claim 7, wherein the line width of the first conductive line layer is in a range of approximately 2.5 μm to approximately 10 μm; and
the line thickness of the first conductive line layer is in a range of approximately 0.25 μm to approximately 1 μm.

9. The display panel of claim 1, wherein the first conductive line layer is on a side of the sealant layer distal to the second substrate.

10. The display panel of claim 1, wherein the display panel is an organic light emitting diode display panel;
the first substrate comprises a first base substrate, a gate insulating layer on the first base substrate, a gate electrode layer on a side of the gate insulating layer distal to the first base substrate, and an inter-layer dielectric layer on a side of the gate electrode layer distal to the gate insulating layer; and
the first conductive line layer is on a side of the sealant layer proximal to inter-layer dielectric layer.

11. The display panel of claim 1, wherein the sealant layer is a frit seal layer comprising a frit seal material.

12. The display panel of claim 1, wherein an orthographic projection of the first continuous conductive line on the first substrate has a square wave pattern.

13. A display apparatus, comprising the display panel of claim 1; and a driver integrated circuit boned to the two bonding leads.

14. A method of detecting crack in a sealant layer of a display panel of claim 1, comprising:
measuring a resistance of the first continuous conductive line;
wherein the resistance greater than a threshold value indicates presence of crack in the sealant layer.

15. A substrate, comprising:
a sealant layer; and
a first conductive line layer comprising a first continuous conductive line configured to detect crack in the sealant layer;
a second conductive line layer comprising a second continuous conductive line configured to detect crack in the substrate;
two lead wires respectively connecting two terminals of the first conductive line layer to the second conductive line layer; and
two bonding leads in a driver integrated circuit bonding area, the two bonding leads electrically connected to the second conductive line layer;
wherein the first conductive line layer is in contact with the sealant layer;
the second conductive line layer is in a peripheral area of the substrate;
an orthographic projection of the sealant layer on a base substrate of the substrate is substantially non-overlapping with an orthographic projection of the second conductive line layer on the base substrate; and the first conductive line layer is electrically connected to the two bonding leads sequentially through the two lead wires and the second conductive line layer.

16. The substrate of claim 15, wherein
the first conductive line layer is in the peripheral area of the substrate and substantially encircles a display area of the substrate; and
an orthographic projection of the sealant layer on the substrate substantially covers that of the first conductive line layer.

17. A method of fabricating a display panel, comprising:
forming a first substrate;
forming a second substrate;
forming a sealant material layer on the second substrate, the sealant material layer being formed in a peripheral area of the second substrate and enclosing a display area of the second substrate;
forming a first conductive line layer comprising a first continuous conductive line on the first substrate, the first conductive line layer being formed in a peripheral area of the first substrate and encircling a first area of the first substrate;
forming a second conductive line layer comprising a second continuous conductive line configured to detect crack in the display panel;
forming two lead wires respectively connecting two terminals of the first conductive line layer to the second conductive line layer; and
forming two bonding leads in a driver integrated circuit bonding area, the two bonding leads electrically connected to the second conductive line layer; and
assembling the first substrate and the second substrate in a cell by adhering the sealant material layer onto the first substrate, thereby forming a sealant layer sealing a display area of the display panel;
wherein the first conductive line layer is formed to be in contact with the sealant layer;
the second conductive line layer is in a peripheral area of the display panel;
an orthographic projection of the sealant layer on the first substrate is substantially non-overlapping with an orthographic projection of the second conductive line layer on the first substrate; and
the first conductive line layer is electrically connected to the two bonding leads sequentially through the two lead wires and the second conductive line layer.

\* \* \* \* \*